(12) United States Patent
Shipley et al.

(10) Patent No.: US 8,165,291 B2
(45) Date of Patent: Apr. 24, 2012

(54) RANDOM SEED STABILITY WITH FUSES

(75) Inventors: Gerald L. Shipley, Hillsboro, OR (US);
David A. Castaneda, Clackamas, OR (US)

(73) Assignee: LSI Corporation, Milpitas, CA (US)

( * ) Notice: Subject to any disclaimer, the term of this patent is extended or adjusted under 35 U.S.C. 154(b) by 1644 days.

(21) Appl. No.: 11/466,867

(22) Filed: Aug. 24, 2006

(65) Prior Publication Data

US 2008/0068003 A1    Mar. 20, 2008

(51) Int. Cl.
*H04L 9/00* (2006.01)
(52) U.S. Cl. ......................................................... 380/46
(58) Field of Classification Search .................. 375/316, 375/346; 324/116, 764; 716/4; 340/539.1, 340/10.1, 572.1; 380/46
See application file for complete search history.

(56) References Cited

U.S. PATENT DOCUMENTS

| | | | |
|---|---|---|---|
| 6,161,213 A | 12/2000 | Lofstrom | |
| 6,175,912 B1 * | 1/2001 | Alidina et al. | 712/222 |
| 6,738,788 B1 | 5/2004 | Horng et al. | |
| 6,802,447 B2 | 10/2004 | Horng | |
| 7,216,145 B2 * | 5/2007 | Collings, III | 709/206 |
| 7,437,646 B2 * | 10/2008 | Maruyama | 714/738 |
| 7,802,156 B2 * | 9/2010 | Bitting et al. | 714/724 |
| 2005/0183047 A1 | 8/2005 | Sapiro | |
| 2007/0168843 A1 * | 7/2007 | Kanaoka et al. | 714/792 |

OTHER PUBLICATIONS www.siidtech.com, web site for SiidTech Inc., captured on Aug. 24, 2006.

* cited by examiner

*Primary Examiner* — Philip Lee
(74) *Attorney, Agent, or Firm* — Luedeka Neely Group, P.C.

(57) ABSTRACT

A circuit for stabilizing soft bits in a bit stream, the circuit having a first register to receive an initial read of the bit stream, a second register to receive a subsequent read of the bit stream, a comparator to compare the initial read of the bit stream to the subsequent read of the bit stream, a third register to receive a comparison string having bits set in positions where the initial read of the bit stream and the subsequent read of the bit stream do not match, indicating a soft bit in the positions, and an accumulator to receive the comparison string for multiple subsequent reads of the bit stream, and track positions of all soft bits detected during the multiple subsequent reads.

9 Claims, 2 Drawing Sheets

RANDOM SEED STABILITY WITH FUSES

FIELD

This invention relates to the field of integrated circuit fabrication. More particularly, this invention relates to correcting soft bits in a bit stream, such as can be used to uniquely identify integrated circuits or provide an encryption key.

BACKGROUND

Integrated circuits have evolved into enormously complex devices, which are fabricated by equally complex processes. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

Integrated circuits are typically processed in a wafer form on a common semiconducting substrate, which substrate typically holds something in the neighborhood of a few hundred individual integrated circuits, depending on die size and wafer size. A variety of information on the processing of the substrate is typically recorded in a database. Thus, while the integrated circuits are in wafer form, it is relatively easy to look back upon the recorded processing history for the integrated circuits, by first identifying the substrate upon which the integrated circuits reside, and then accessing the information for the substrate. Such information can be very useful in determining the causes of problems that might be noticed at a later point in the fabrication cycle.

However, once the individual integrated circuits are singulated and packaged, it might be impossible to determine the substrate from which a given integrated circuit was taken, and the processing that the substrate received. However, for a variety of different reasons, such information could be extremely useful. For example, determining the processing given an integrated circuit that failed in the field could help prevent additional future failures for the same cause.

What is needed, therefore, is a system that overcomes problems such as those described above, at least in part.

SUMMARY

The above and other needs are met by a circuit for stabilizing soft bits in a bit stream, the circuit having a first register to receive an initial read of the bit stream, a second register to receive a subsequent read of the bit stream, a comparator to compare the initial read of the bit stream to the subsequent read of the bit stream, a third register to receive a comparison string having bits set in positions where the initial read of the bit stream and the subsequent read of the bit stream do not match, indicating a soft bit in the positions, and an accumulator to receive the comparison string for multiple subsequent reads of the bit stream, and track positions of all soft bits detected during the multiple subsequent reads.

In this manner, the circuit is able to produce a stable and unique bit string, without revealing the bit string outside of the integrated circuit, or other circuit, on which it resides. Thus, the bit string is sufficient for use as an identification value or as an encryption key.

In various alternate embodiments, a logic circuit sends the initial read of the bit stream to the first register and resets the accumulator after an initialization, and sends the subsequent read of the bit stream to the second register. Preferably, the comparator is an XOR cell. A broken seed detector preferably determines whether the bit stream is sufficient for use as at least one of a unique identification string and an encryption key.

According to another aspect of the invention there is described a method of stabilizing soft bits in a bit stream, by receiving an initial read of the bit stream, receiving a subsequent read of the bit stream, comparing the initial read of the bit stream to the subsequent read of the bit stream, producing a comparison string having bits set in positions where the initial read of the bit stream and the subsequent read of the bit stream do not match, indicating a soft bit in the positions, and receiving the comparison string for multiple subsequent reads of the bit stream, and tracking positions of all soft bits detected during the multiple subsequent reads.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

With reference now to the figures, there is depicted a method and apparatus for providing a unique chip identification circuit 10 for an integrated circuit, which chip identification does not require specialized processing to create the unique identification for the integrated circuit, and which is stable and can be reliably read across repeated instances and a duration of time. In addition, the circuitry as described herein may also be used to produce a stable encryption key, and for other high security applications.

In basic concept, there is provided a seed generator 12 and supporting circuitry in a design 10 that is added to each individual integrated circuit as a part of the mask set for the integrated circuits. Thus, as the integrated circuits are fabricated in wafer form, the circuit 10 is fabricated at the same time. Thus, no additional processing is required to fabricate the circuit 10.

Figure 1:
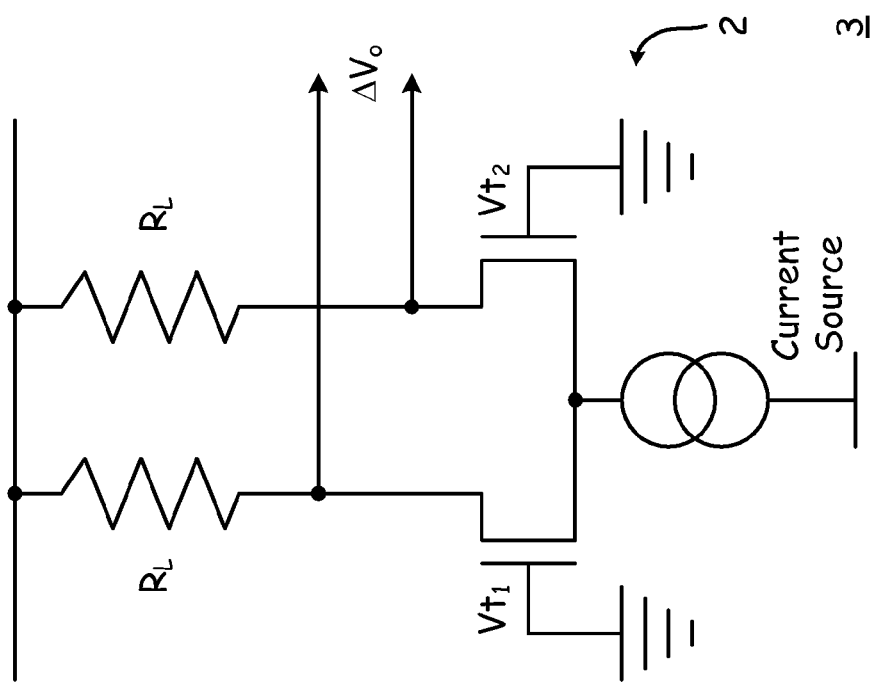
FIG. 1 is a circuit diagram of one embodiment of a die trace bit cell for use in a chip identification or encryption key circuit.

The circuit 10 preferably has at least one property such the circuits 10 on different chips will produce at least one characteristic that is different from chip to chip, even though the circuit 10 on each of the different chips receives the same input. FIG. 1 depicts one example of a die trace bit cell 2 on an integrated circuit 3, from which the seed generator 12 for a circuit 10 can be constructed. It is appreciated that other circuits may also be used for the seed generator 12. The cell 2 comprises two transistors having a voltage threshold $Vt_1$ and $Vt_2$. The two transistors are preferably connected to a common current source, ground, and current drain through two resistors $R_L$.

Because of the similarities in the fabrication and design of the two transistors, it might be expected that they would have exactly the same voltage threshold. However, very subtle differences in the transistors typically arise such as by "chance" or other uncharacterized processing and material differences. Thus, there tends to be a measurable difference $\Delta V_0$ between the voltage thresholds $Vt_1$ and $Vt_2$. Depending upon which of the two voltage thresholds is greater than the other, this voltage difference can be interpreted as either a logical zero or a logical one from the bit cell 2. Practically speaking, the value of the bit cell 2, either zero or one, tends to be completely random from one integrated circuit to another.

Figure 2:
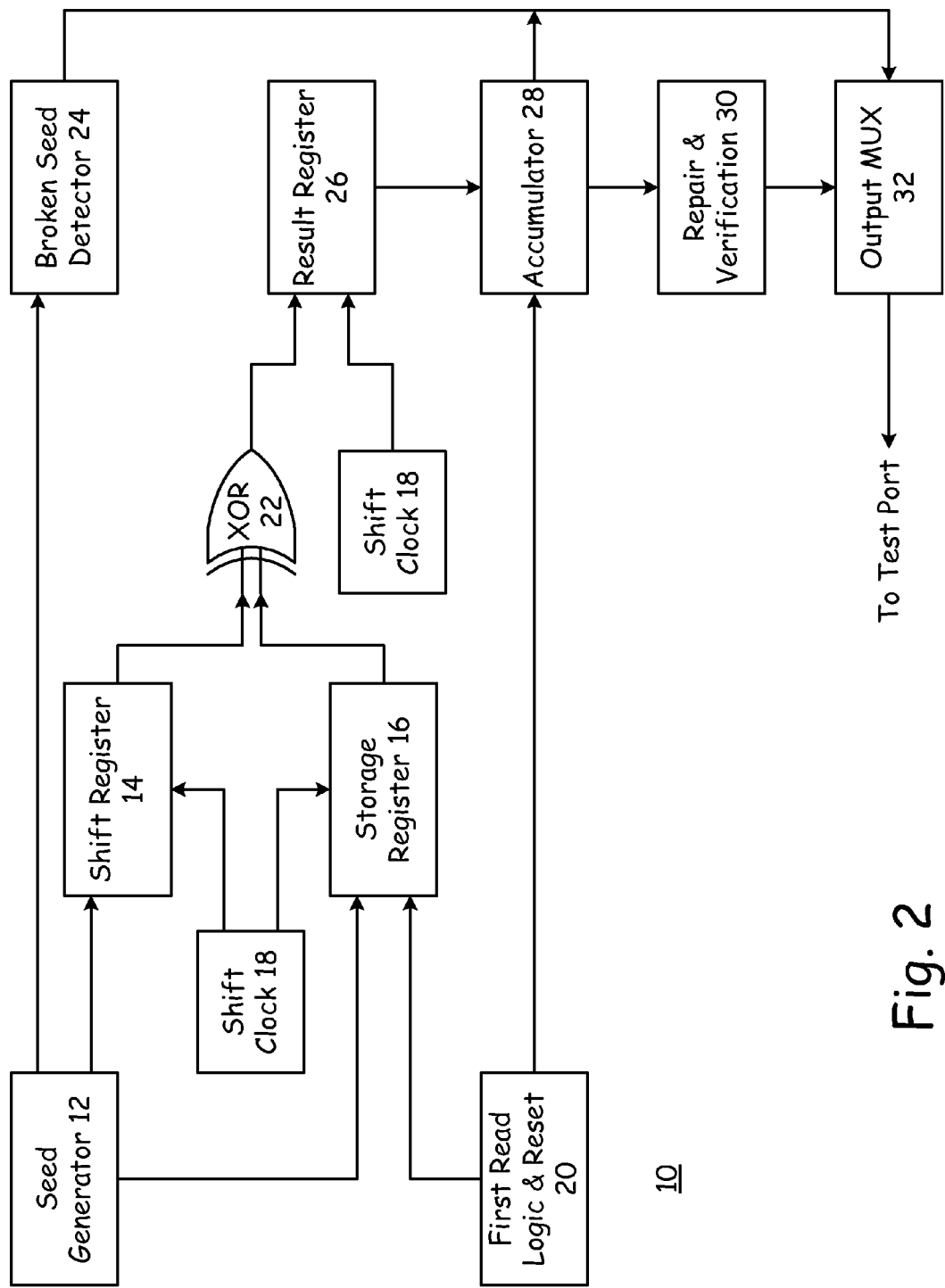
FIG. 2 is a test circuit for identifying unstable bits in a bit stream produced by a seed generator, without revealing the seed contents outside the circuit.

Thus, by stringing together a given number of the bit cells 2—such as 128, 256, or some other number—a seed generator 12, as depicted in FIG. 2, can be formed that has a desired number of random values. For example, 128 of the bit cells 2 could be formed into the seed generator 12, and the circuit 10 would have a random 128 bit value. By forming a circuit 10 with a great enough number of bit cells 2 (where "great enough" is determined by the number of integrated circuits that are to be identified), each integrated circuit having the chip identification circuit 10 can be uniquely identified by reading the chip identification circuit 10. Further, a value of sufficient complexity can be formed for use as an encryption key, or for other security applications.

Unfortunately, some of the bit cells 2 have transistors with voltage thresholds $Vt_1$ and $Vt_2$ that are so close in value one to another, that the voltage differential $\Delta V_0$ is either so small that it cannot be reliably read, or actually flips back and forth in value from negative to positive (for example). Thus, such a bit cell 2, referred to as a soft cell that produces a soft bit, would tend to change its value in an unpredictable manner as it is read from time to time, thereby changing the value of the seed generator 12. This tends to make the seed generator 12 unreliable as a means for uniquely and repeatedly identifying the integrated circuit or producing an encryption key. Therefore, it is desirable to identify such soft cells 2, and either remove them in some manner from the seed generator 12 or fix them to some stable value. This is accomplished by the rest of the circuitry in the circuit 10.

The seed generator 12 receives an input that causes it to produce a sample series of bits, such as in the manner as described above. On the first such sample, the bit stream is fed into a storage register 16, which can have its contents shifted out. The seed generator 12 is then read a second time, and the series of bits is read into a shift register 14, while the storage register 16 maintains the bit stream that was read out on the first read of the seed generator 12.

This process of reading the bit stream from the seed generator 12 is preferably controlled by a logic circuit 20, which determines whether or not the bit stream will be read into the storage register 16. It is appreciated that the bit stream could be read into the storage register 16 at some time after the first reading of the seed generator 12, which would effectually constitute a re-initialization of the circuit 10.

After the bit stream is read into the shift register 14, the contents of both the shift register 14 and the storage register 16 are input to an XOR circuit 22, under the control of a shift clock 18. The XOR circuit 22 produces values that are indicative of whether the bits that are disposed in like positions in the bit streams shifted out of the shift register 14 and the storage register 16 are identical. The results of the XOR circuit 22 are fed, under control of the shift clock 18, to a result register 26. The result register 26 will then preferably contain a series of bits of the same length as the bit stream that is fed from the seed generator 12 to the shift register 14 and the storage register 16, and which indicates which bit positions in the bit stream are unstable, in that they have changed from one reading to another. Thus, one function of the circuit 10 is to identify bits that read differently from one reading to another, regardless of when the change occurs or how many times it occurs.

The bit stream from the result register 26 is then loaded into the accumulator 28, which is preferably a clearable set/reset register. Bit positions in the result register 26 that hold the results of the XOR circuit 22 will set the corresponding bits in the accumulator 28, while bits in the accumulator 28 that have already been set will remain set. Thus, a plurality of additional reads can be made on the seed generator 12 into the shift register 14, and compared with the initialization read in the storage register 16, to determine which bits in the bit stream might shift over time. If a bit ever shifts during this process, then the position of that soft bit is stored in the accumulator 28. If an initialization of the circuit 10 is desired, then the logic 20 preferably clears the accumulator 28.

A broken seed detector 24 preferably looks for sequences of all 1's or all 0's in the bit stream, or "long" strings of such that might compromise the usefulness of the bit stream as a unique identification or encryption key. For example, if the entire string was all one value, or contained a substring of substantial length that was all one value, then the statistical usefulness of the bit stream could be dramatically reduced. The test port at the output of the circuit 10 can thus preferably be queried for this defect.

The accumulator 28 can preferably be directly read to identify which bits are unstable. This information is preferably used to generate a solution to correct the soft bits in some manner by the repair and verification circuit 30, which initiates a repair solution as described below, and then verifies that the solution has repaired the problem and that the soft bits are now stable. When the bits are stabilized, then the accumulator 28 will have no bits set, by which the verification circuit 30 can know that the solution was effective.

One solution that could be implemented is to fit each cell 2, for example, in the seed generator 12 with a fuse link. If the cell 2 is a soft cell that produces variable bit values, then the fuse is physically severed by a laser cut, which then sets the cell 2 to a specific value. Thus, on subsequent reads, the formerly soft cell 2 will always produce the same value, and the soft cell is corrected. This is one example of a physical solution.

Alternately, the bit stream in the accumulator 28, which indicates the position of each bit in the stream that has ever been soft on the various reads of the seed generator 12, can be used as a mask to set the bits in those soft positions to a specific value. In this manner, no special post processing such as laser cutting is needed to repair the circuit 10. This is one example of a soft or logical solution.

The repair circuit 30, or some other circuit, may also control the number of reads of the seed generator 12 that are used to determine whether "all" of the soft bits in the bit stream have been found. This is preferably a statistical process, as an infinite number of reads would be required to determine with absolute certainty that no soft bits remained undetected. Thus, the circuit preferably makes a number of reads that produces a bit string that is stable to within a statistically desirable probability. This string is preferably output as desired to the test port through the MUX 32, which is preferably used to control the output of the circuit 10.

Thus, there are many benefits to the circuit 10. The circuit 10 identifies encryption keys that have long sequences of high or low bits, and allows identification of unstable bits without reading out the key itself. The circuit 10 also allows for an unlimited number of read cycles to determine the unstable bits. The circuit 10 allows the readout of the unstable bit positions to produce a software or hardware mask of those bits when using the encryption key. The circuit 10 provides data security, as it allows verification of the encryption key integrity without disclosing the data contents of the key. The cost to test the circuit 10 is low, as the test circuitry required on automated test equipment is just a single tester channel. Readout and data stability collection on the circuit 10 can be done at ASIC functional rates, thus reducing the test time and increasing the number of samples tested. Further, the accumulator 28 function is not limited to any maximum number of samples or length of time.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A circuit for stabilizing soft bits in a bit stream, the circuit comprising:
    a first register adapted to receive an initial read of the bit stream,
    a second register adapted to receive a subsequent read of the bit stream,
    a comparator adapted to compare the initial read of the bit stream to the subsequent read of the bit stream,
    a third register adapted to receive a comparison string having bits set in positions where the initial read of the bit stream and the subsequent read of the bit stream do not match, indicating a soft bit in the positions, and
    an accumulator adapted to receive the comparison string for multiple subsequent reads of the bit stream, and track positions of all soft bits detected during the multiple subsequent reads.

2. The circuit of claim 1, further comprising a logic circuit adapted to send the initial read of the bit stream to the first register and reset the accumulator after an initialization, and send the subsequent read of the bit stream to the second register.

3. The circuit of claim 1, wherein the comparator is an XOR cell.

4. The circuit of claim 1, further comprising a broken seed detector adapted to determine whether the bit stream is stable to within a statistically desirable probability for use as at least one of a unique identification string and an encryption key.

5. An integrated circuit having a circuit for stabilizing soft bits in a bit stream, the circuit comprising:
    a first register adapted to receive an initial read of the bit stream,
    a second register adapted to receive a subsequent read of the bit stream,
    a comparator adapted to compare the initial read of the bit stream to the subsequent read of the bit stream,
    a third register adapted to receive a comparison string having bits set in positions where the initial read of the bit stream and the subsequent read of the bit stream do not match, indicating a soft bit in the positions, and
    an accumulator adapted to receive the comparison string for multiple subsequent reads of the bit stream, and track positions of all soft bits detected during the multiple subsequent reads.

6. The integrated circuit of claim 5, further comprising a logic circuit adapted to send the initial read of the bit stream to the first register and reset the accumulator after an initialization, and send the subsequent read of the bit stream to the second register.

7. The integrated circuit of claim 5, wherein the comparator is an XOR cell.

8. The integrated circuit of claim 5, further comprising a broken seed detector adapted to determine whether the bit stream is stable to within a statistically desirable probability for use as at least one of a unique identification string and an encryption key.

9. A method of stabilizing soft bits in a bit stream, the method comprising the steps of:
    receiving an initial read of the bit stream,
    receiving a subsequent read of the bit stream,
    comparing the initial read of the bit stream to the subsequent read of the bit stream,
    producing a comparison string having bits set in positions where the initial read of the bit stream and the subsequent read of the bit stream do not match, indicating a soft bit in the positions, and
    receiving the comparison string for multiple subsequent reads of the bit stream, and tracking positions of all soft bits detected during the multiple subsequent reads.

* * * * *